United States Patent
Iwamoto et al.

(10) Patent No.: US 10,665,488 B2
(45) Date of Patent: May 26, 2020

(54) LOAD PORT APPARATUS AND METHOD OF DRIVING THE SAME

(71) Applicant: TDK CORPORATION, Tokyo (JP)

(72) Inventors: Tadamasa Iwamoto, Tokyo (JP); Hiroshi Igarashi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/142,652

(22) Filed: Sep. 26, 2018

(65) Prior Publication Data

US 2019/0096728 A1 Mar. 28, 2019

(30) Foreign Application Priority Data

Sep. 27, 2017 (JP) .................................. 2017-186358

(51) Int. Cl.
*H01L 21/677* (2006.01)

(52) U.S. Cl.
CPC .. *H01L 21/67775* (2013.01); *H01L 21/67772* (2013.01)

(58) Field of Classification Search
CPC .................................................. H01L 21/67775
USPC ......................................................... 414/217
See application file for complete search history.

(56) References Cited

U.S. PATENT DOCUMENTS

| 2008/0056861 | A1 | 3/2008 | Takahashi et al. |
| 2010/0098517 | A1* | 4/2010 | Hishiya ............. H01L 21/67772 414/160 |
| 2015/0221538 | A1 | 8/2015 | Ochiai et al. |

FOREIGN PATENT DOCUMENTS

| JP | 2004-006804 A | 1/2004 |
| JP | 2010-098121 A | 4/2010 |
| KR | 2008-0021563 A | 3/2008 |
| TW | 2015-30683 A | 8/2015 |

\* cited by examiner

*Primary Examiner* — Saul Rodriguez
*Assistant Examiner* — Willie Berry, Jr.
(74) *Attorney, Agent, or Firm* — Oliff PLC

(57) ABSTRACT

A load port apparatus connects a main opening of a wafer transportation container with a frame opening. The load port apparatus includes an installation part, a frame, and a flange clamp. The installation part has an installation table configured to install the wafer transportation container and move to and from the frame opening. The frame is upright from the installation part and has the frame opening. The flange clamp includes an engagement portion and a drive portion. The engagement portion is configured to be engaged with a flange surrounding an outer circumference of the main opening. The drive portion is configured to drive the engagement portion. The engagement portion is engaged from above or the side with a flange groove formed in the flange and opening radially outwardly.

13 Claims, 6 Drawing Sheets

FIG.6A
FIG.6B
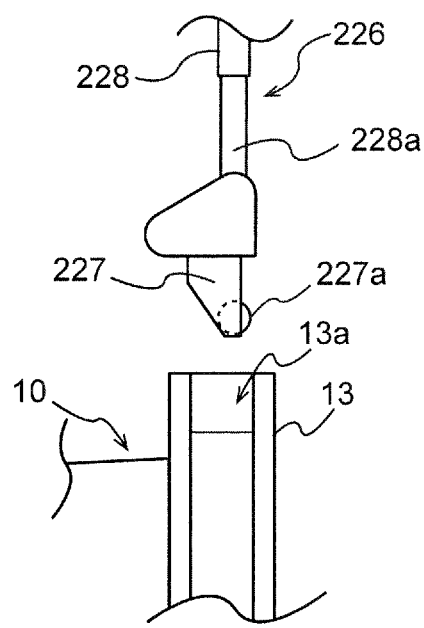
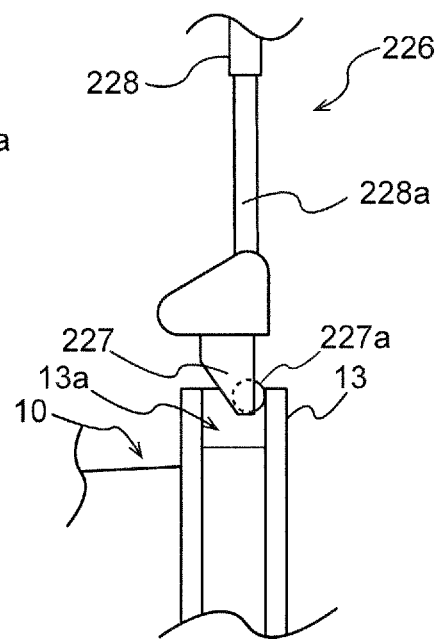

LOAD PORT APPARATUS AND METHOD OF DRIVING THE SAME

BACKGROUND OF THE INVENTION

The present invention relates to a load port apparatus and a method of driving the same.

In a manufacturing process of semiconductors, wafers are transported between processing devices using a wafer transportation container referred to as FOUP, FOSB, etc. The wafer transportation container includes a main opening for taking in and out wafers and a lid for closing the main opening. The wafers in the wafer transportation container are stored in a sealed space by the lid.

When the lid of the wafer transportation container is opened to take out the wafers from the wafer transportation container and introduce a cleaning gas from the main opening of the wafer transportation container thereinto, used is a load port apparatus for connecting the wafer transportation container with a wall opening. When the load port apparatus is used, the internal space of the wafer transportation container can airtightly be connected with another space, such as minienvironment, via the opening, and the wafers in the container can be taken in and out therefrom while the wafers are being isolated from other spaces in the semiconductor factory.

As a technique of preventing a positional displacement of the wafer transportation container, such as FOUP, proposed is a load port including a pressing arm configured to be engaged with an upper part of a FOUP (see Patent Document 1).

Patent Document 1: JP2010098121 (A)

BRIEF SUMMARY OF INVENTION

In the technique using a pressing arm configured to be engaged with an upper part of a FOUP, a positional displacement of the FOUP is prevented, but the pressing arm is large and moves over a large distance, and there is thereby a problem with downsizing of apparatus. Since the pressing arm moves over a large distance, the technique needs the time for a positional change of the pressing arm and has a problem with reduction in operation time.

The present invention has been achieved under such circumstances. It is an object of the invention to provide a load port apparatus capable of appropriately connecting a wafer transportation container with a frame opening by a small mechanism that can operate quickly.

To achieve the above object, the load port apparatus according to the first aspect of the present invention is a load port apparatus for connecting a main opening of a wafer transportation container with a frame opening, comprising:

an installation part having an installation table configured to install the wafer transportation container and move to and from the frame opening;

a frame being upright from the installation part and having the frame opening; and a flange clamp including:

an engagement portion configured to be engaged with a flange surrounding an outer circumference of the main opening; and a drive portion configured to drive the engagement portion, wherein the engagement portion is engaged from above or the side with a flange groove formed in the flange and opening radially outwardly.

The load port apparatus according to the first aspect of the present invention comprises the engagement portion configured to be engaged with the flange groove of the wafer transportation container. When the wafer transportation container moves to a dock position, the flange groove is disposed closely to the frame, and the small engagement portion can thereby securely be engaged with the wafer transportation container. The engagement portion can have a small movement distance, and the flange clamp can thereby operate in a short time. The engagement portion can maintain an appropriate connection state between the wafer transportation container and the frame opening by limiting the movement of the wafer transportation container.

For example, the load port apparatus according to the second aspect of the present invention is a load port apparatus for connecting a main opening of a wafer transportation container with a frame opening, comprising:

an installation part having an installation table configured to install the wafer transportation container and move to and from the frame opening;

a frame being upright from the installation part and having the frame opening;

a flange clamp including:

an engagement portion configured to be engaged with a flange surrounding an outer circumference of the main opening; and a drive portion configured to drive the engagement portion; and a cover portion disposed at least at an upper part or a side part of the frame opening and at least partially covering a periphery of the frame opening, wherein at least when the engagement portion is stopped, the flange clamp is disposed between a periphery opposing surface of the periphery facing the flange and a cover separate surface of the cover portion located farthest from the periphery opposing surface in a transportation direction of the wafer transportation container by the installation part.

The load port apparatus according to the second aspect of the present invention comprises the flange clamp disposed between the cover separate surface and the periphery opposing surface at least when the engagement portion is stopped. When the wafer transportation container moves to the dock position, the flange clamp is close to the flange, and it is thereby possible to downsize the engagement portion and reduce a movement distance of the engagement portion and the time for engagement operation. The engagement portion can maintain an appropriate connection state between the wafer transportation container and the frame opening by being engaged with the flange and limiting the movement of the wafer transportation container.

For example, the cover portion may be thicker than the flange clamp in the transportation direction. The flange clamp may be disposed within 75 mm from the periphery opposing surface in the transportation direction.

When the flange clamp is thinner than the cover portion, the flange clamp can be disposed in a predetermined region from the periphery opposing surface, and the flange clamp can securely be prevented from disturbing a vertical movement of the wafer transportation container.

For example, the engagement portion may be disposed above the frame opening.

When the engagement portion is disposed above the frame opening, the flange clamp can push the wafer transportation container at a separate position from a contact position between the installation table and the wafer transportation container. Thus, the load port apparatus comprising the flange clamp can effectively prevent the wafer transportation container from being displaced from an ideal installation position.

For example, the drive portion may move the engagement portion between:
- a retreat position failing to interfere with a traffic line of the wafer transportation container; and
- an engagement position interfering with the traffic line and engaged with the flange.

The flange clamp comprising the drive portion and the engagement portion can hold the wafer transportation container with an appropriate posture at the dock position without disturbing the transportation of the wafer container by the installation part.

For example, the engagement portion may be engaged with the flange so as to push a flange opposing surface of the flange facing the periphery opposing surface against the periphery opposing surface.

The engagement portion can increase the sealability between the flange opposing surface and the periphery opposing surface and prevent generation of leak from a clearance between the flange and the frame.

For example, an engagement of the engagement portion with the flange may enable the flange opposing surface to be positioned between:
- a lid outer surface of a lid attached detachably to the main opening, wherein the lid outer surface faces a door configured to be engaged with the lid; and
- a lid back surface opposite to the lid outer surface in the transportation direction.

The engagement portion is small and further disposed closely to the flange. Thus, the engagement portion can be engaged with the flange with a small movement distance and operate in a short time. Thus, the load port apparatus can operate in a short time.

The method of driving the load port apparatus according to the present invention is a method of driving a load port apparatus for connecting a main opening of a wafer transportation container with a frame opening, comprising:
- a step of moving an installation table installing the wafer transportation container to a dock position where the main opening moves close to the frame opening; and
- a step of driving an engagement portion configured to be engaged with a flange surrounding an outer circumference of the main opening by a drive portion configured to drive the engagement portion so as to engage the engagement portion with the wafer transportation container located at the dock position,
- wherein the engagement portion is engaged from above or the side with a flange groove formed in the flange and opening radially outwardly.

In the method of driving the load port apparatus according to the present invention, when the wafer transportation container moves to the dock position, the flange groove is disposed closely to the frame, and the small engagement portion can securely be engaged with the wafer transportation container. Moreover, the engagement portion can move in a small movement distance, and the method of driving the load port apparatus can thereby finish operation in a short time. In the method, the engagement portion limits the movement of the wafer transportation container, and an appropriate connection state between the wafer transportation container and the frame opening can thereby be maintained.

BRIEF DESCRIPTION OF DRAWINGS

FIGS. 6A and 6B are conceptual views illustrating a motion state of a flange clamp according to Second Variation.

DETAILED DESCRIPTION OF INVENTION

Hereinafter, the present invention is described based on an embodiment shown in the figures.

Figure 1:
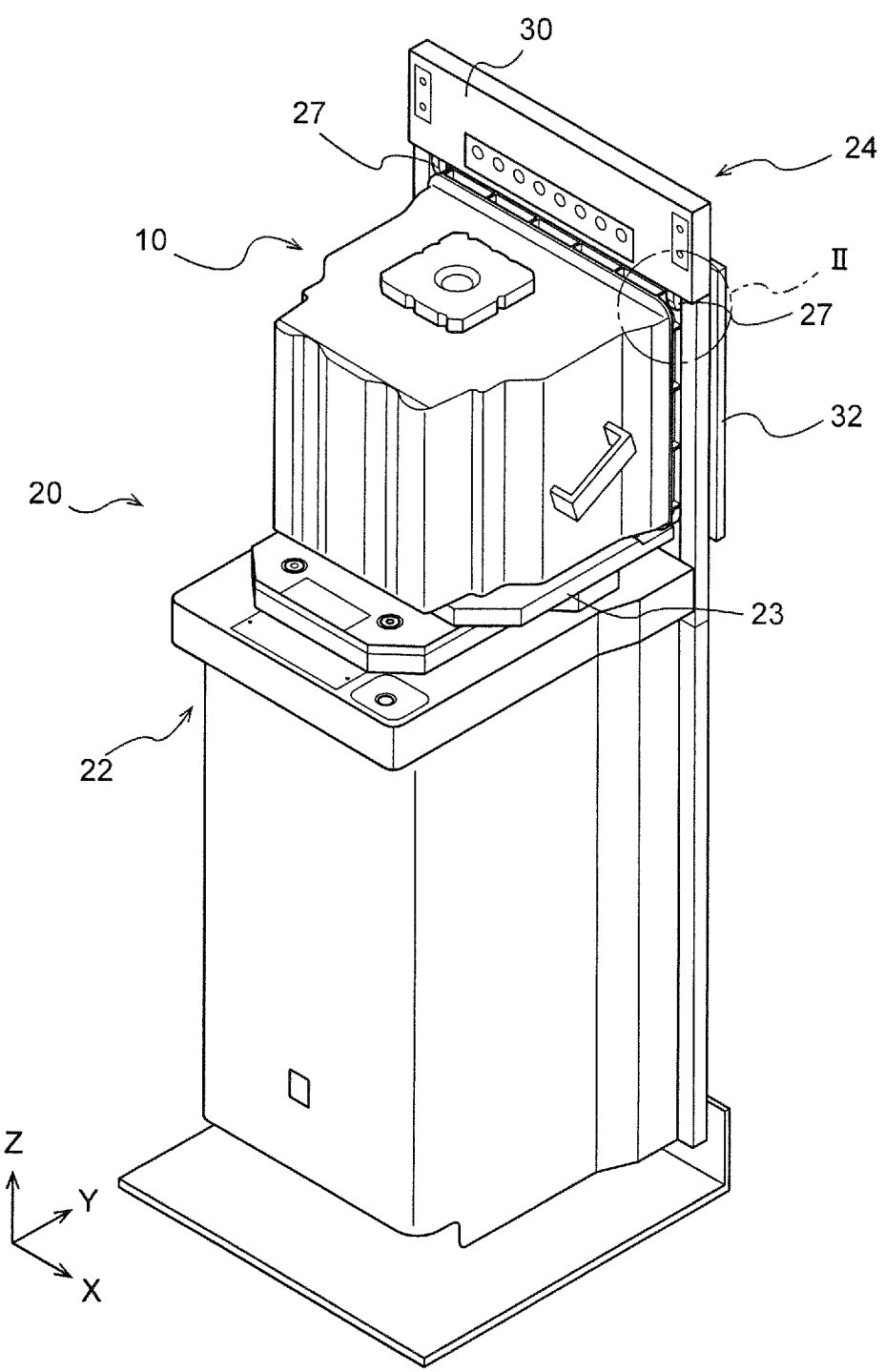
FIG. 1 is a schematic view of a load port apparatus according to an embodiment of the present invention.

FIG. 1 is a schematic perspective view of a load port apparatus 20 according to an embodiment of the present invention. For example, the load port apparatus 20 is used as an interface that connects a wafer transportation container 10 with a space where a minienvironment is formed in a semiconductor factory. The load port apparatus 20 is placed so that a frame 24 constitutes a part of side walls forming a minienvironment. The load port apparatus 20 connects a main opening 12a of the wafer transportation container 10 shown in FIG. 1 with a frame opening 24a (see FIG. 3 and FIG. 2).

Figure 3:
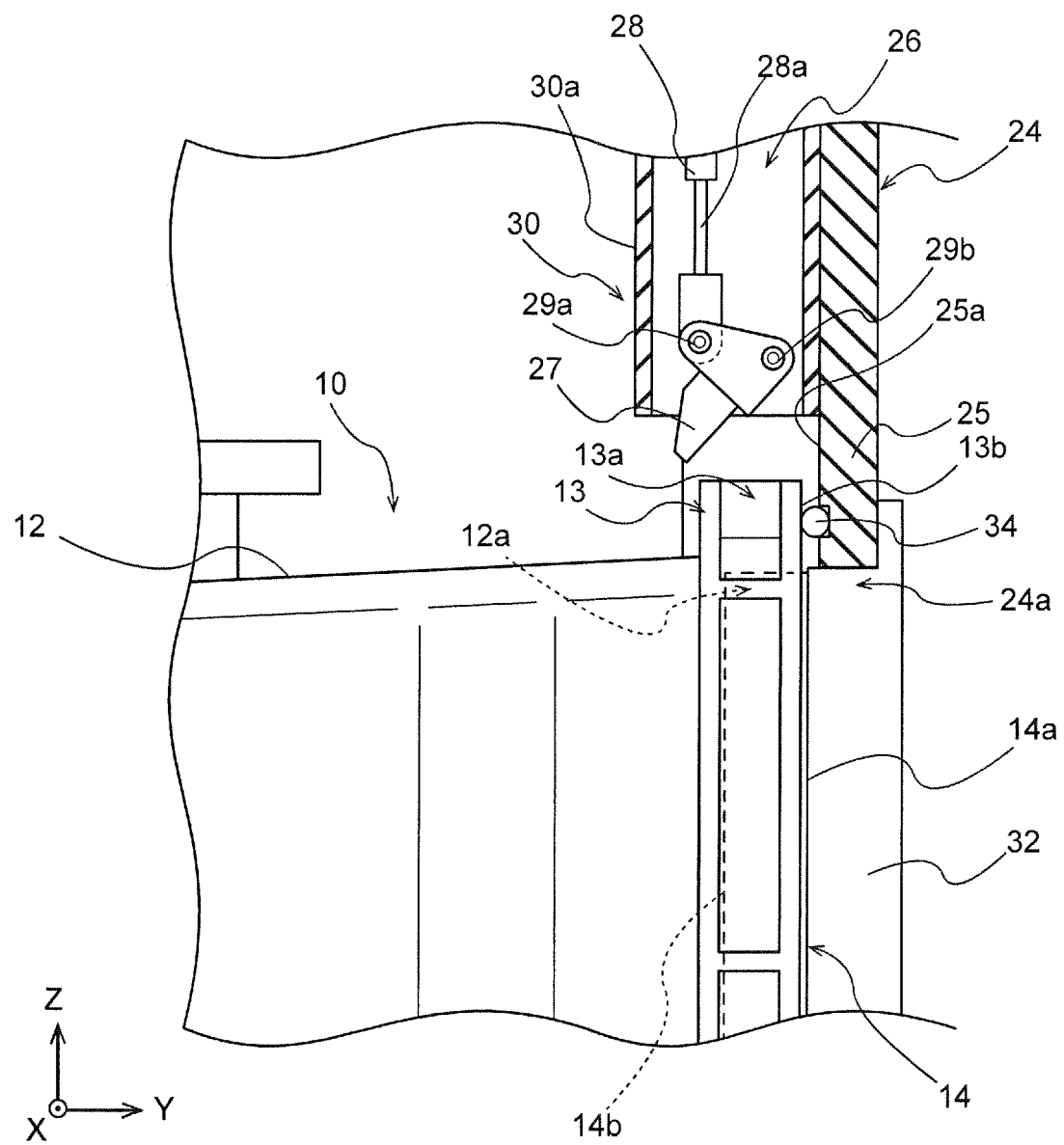
FIG. 3 is a conceptual view illustrating a first motion state of a flange clamp shown in FIG. 1.

As shown in FIG. 1, the load port apparatus 20 includes an installation part 22 having an installation table 23, the frame 24 with the frame opening 24a, a cover portion 30, a door 32, and a flange clamp 26 shown in FIG. 3. Moreover, the load port apparatus 20 includes a bottom clamp part (not shown) configured to be engaged with a bottom of the wafer transportation container 10 and fix it to the installation part 22, a bottom purge part (not shown) configured to introduce a cleaning gas from the bottom of the wafer transportation container 10 thereinto, and the like.

As shown in FIG. 1, the wafer transportation container 10 is installed in the installation part 22 of the load port apparatus 20. The wafer transportation container 10 is a container for transportation of wafers in a semiconductor factory or so, such as FOUP and FOSB conforming to SEMI standard. However, the wafer transportation container 10 is not limited to them, and may be another container capable of transporting or storing wafers in sealed state.

The wafer transportation container 10 has an outer shape of substantially rectangular-parallelepiped or substantially cubic. The wafer transportation container 10 includes a housing 12 and a lid 14. The main opening 12a (see FIG. 3) for taking in and out wafers is formed on a side surface of the housing 12. The lid 14 is disposed detachably in the housing 12 and blocks the main opening 12a. A groove (not shown) configured to be engaged with the bottom clamp part of the load port apparatus 20 is formed on a bottom surface of the housing 12.

Figure 2:
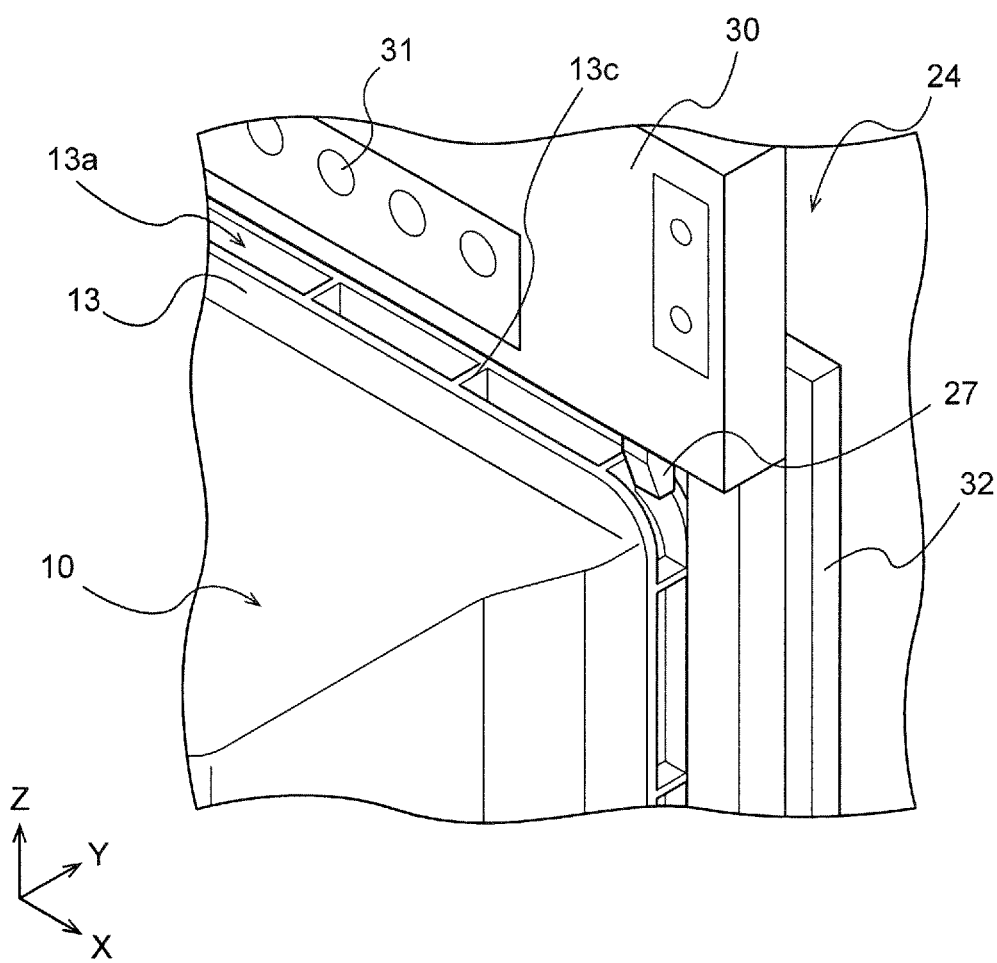
FIG. 2 is a partially enlarged view of the load port apparatus shown in FIG. 1.

As shown in FIG. 2, which is a partially enlarged view of FIG. 1, the housing 12 of the wafer transportation container 10 includes a flange 13 surrounding an outer circumference of the main opening 12a. The flange 13 is disposed at an end of the housing 12 near the main opening 12a and protrudes radially outward compared to other parts of the wafer transportation container 10 in its center side. A flange groove 13a opening radially outward is formed in the flange 13. Ribs 13c circumferentially dividing the flange groove 13a and strengthening the flange 13 are formed in the flange 13. The flange groove 13a has any radial depth, such as about 1 mm to 25 mm. The ribs 13c are circumferentially arranged at any intervals, such as about 15 mm to 350 mm.

Figure 4:
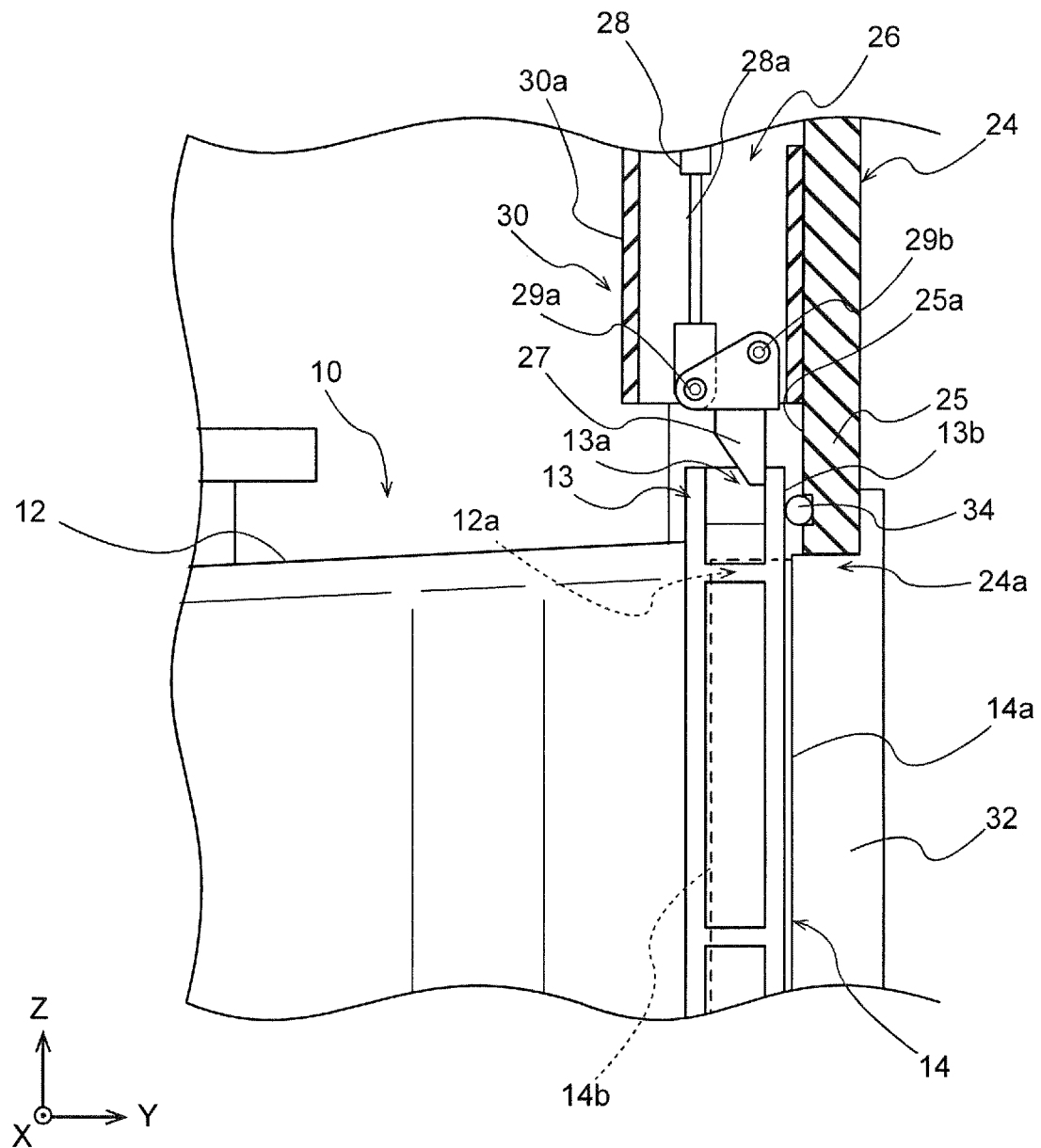
FIG. 4 is a conceptual view illustrating a second motion state of a flange clamp shown in FIG. 1.

When the wafer transportation container 10 is moved to a dock position, as shown in FIG. 3, a flange opposing surface 13b, which is a front surface (positive side in the Y-axis direction) of the flange 13 in a wafer taking-out direction, faces a periphery opposing surface 25a of the frame 24. As shown in FIG. 4, the flange groove 13a can be engaged with engagement portions 27 of the flange clamp 26. Incidentally, a step where the engagement portions 27 are engaged with the flange groove 13a is described below in detail.

As shown in FIG. 3 and FIG. 4, the wafer transportation container 10 includes the lid 14 detachably attached to the main opening 12a. The lid 14 includes a lid outer surface 14a and a lid back surface 14b. The lid outer surface 14a faces the door 32 of the load port apparatus 20. The lid back surface 14b is an opposite surface to the lid outer surface 14a and faces wafers in the housing 12. To securely engage the door 32 and the lid 14, it is preferred that the lid outer surface 14a slightly protrude from the flange opposing surface 13b in the wafer taking-out direction (positive side in the Y-axis direction) while the lid 14 is shutting the main opening 12a.

As shown in FIG. 1, the installation part 22 of the load port apparatus 20 includes the installation table 23 configured to install the wafer transportation container 10. The installation table 23 moves so that the installation table 23 and the wafer transportation container 10 placed on the installation table 23 move to and from the frame opening 24a. The installation table 23 is driven by any driving means, such as air cylinders and motors (not shown). The installation table 23 of the installation part 22 may be not only movable horizontally, but rotatable by 180 degrees while the wafer transportation container 10 is being installed. This may allow the wafer transportation container 10 to change its direction. In the description of the load port apparatus 20, as shown in FIG. 1, the Z-axis direction is the height direction, the Y-axis direction is perpendicular to the Z-axis direction and is a direction where the installation table 23 moves to and from the frame 24, and the X-axis direction is perpendicular to the Z-axis direction and the Y-axis direction.

The frame 24 is upright upwardly from the installation part 22. The frame 24 includes the frame opening 24a located above the installation part 22 and has a frame shape. As shown in FIG. 1 and FIG. 2, the load port apparatus 20 includes the door 32 configured to open and shut the frame opening 24a. The door 32 is driven by a door drive portion (not shown). The door 32 can be engaged with the lid outer surface 14a of the lid 14 of the wafer transportation container 10. The door 32 is engaged and moved with the lid 14, and can remove the lid 14 from the main opening 12a and open it at the same time of opening the frame opening 24a.

As shown in FIG. 1, the cover portion 30 is disposed on a frame periphery 25 of the frame opening 24a (see FIG. 3 and FIG. 4). The cover portion 30 is disposed at least at an upper part or at a side part of the frame opening 24a and covers a part of the frame periphery 25 of the frame opening 24a. That is, as shown in FIG. 3, the cover portion 30 is disposed on a part of the periphery opposing surface 25a of the frame periphery 25 facing the installation table 23 (negative side in the Y-axis direction) in a transportation direction of the wafer transportation container 10 by the installation part 22.

However, another part of the periphery opposing surface 25a adjacent to the frame opening 24a is exposed from the cover portion 30 and faces the flange 13 (particularly, flange opposing surface 13b) of the wafer transportation container 10. A seal portion 34 for improvement in sealability of the flange opposing surface 13b is disposed on the periphery opposing surface 25a. As shown in FIG. 3, the cover portion 30 includes a cover separate surface 30a located farthest from the periphery opposing surface 25a in the transportation direction of the wafer transportation container 10 (Y-axis direction), and state display lamps 31 shown in FIG. 2 are arranged on the cover separate surface 30a. The lightening state of the state display lamps 31 changes based on a driving state of the load port apparatus 20.

As shown in FIG. 3, the load port apparatus 20 includes the flange clamp 26. The flange clamp 26 includes the engagement portions 27 respectively configured to be engaged with the flange 13 of the wafer transportation container 10 and a drive portion 28 configured to drive the engagement portion 27. The flange clamp 26 and the engagement portions 27 included in the flange clamp 26 are arranged above the frame opening 24a. As shown in FIG. 4, the engagement portions 27 can be engaged from above with the flange groove 13a formed in the flange 13 of the wafer transportation container 10.

The engagement portion of the flange clamp 26 is disposed at any position. For example, the engagement portion according to a variation may be disposed at the side of the frame opening 24a. The engagement portion disposed on the side of the frame opening 24a can be engaged with the flange groove 13a of the flange 13 from the side of the frame opening 24a. The flange clamp 26 of the load port apparatus 20 shown in FIG. 1 includes a plurality (two in FIG. 1) of engagement portions 27, and one engagement portion 27 and the other engagement portion 27 are arranged to be engaged with the flange 13 at a symmetrical position to the center of the main opening 12a.

The drive portion 28 of the flange clamp 26 is formed by an air cylinder, a motor, or the like, and can move the engagement portion 27 via a drive shaft 28a. The drive portion 28 shown in FIG. 3 and FIG. 4 includes an air cylinder having the drive shaft 28a configured to move vertically (Z-axis direction) and is connected with the engagement portion 27 via a rotatable connection part 29a. Incidentally, the flange clamp 26 may include one drive portion per one engagement portion 27 as shown in FIG. 3 and FIG. 4, and the flange clamp 26 may include one drive portion per a plurality (e.g., two) engagement portions 27.

The engagement portion 27 of the flange clamp 26 is connected with the drive shaft 28a via the connection part 29a and is further connected with the frame 24 (or the cover portion 30) via a rotatable connection part 29b. As shown in FIG. 3 and FIG. 4, the engagement portion 27 rotates and moves by extension (or vertical movement) of the drive shaft 28a of the drive portion 28 and is engaged with the flange 13 of the wafer transportation container 10.

That is, when the installation table 23 with the wafer transportation container 10 is at an undock position apart from the frame opening 24a, or while the wafer transportation container 10 is being moved by the installation table 23, the engagement portions 27 of the flange clamp 26 are at a retreat position shown in FIG. 3. The engagement portions 27 at the retreat position are configured to avoid interfering with a traffic line of the wafer transportation container 10 (i.e., a movement passage of the wafer transportation container 10).

On the other hand, the installation table 23 with the wafer transportation container 10 moves from the undock position, the main opening 12a of the wafer transportation container 10 moves to a dock position close to the frame opening 24a, and the engagement portion 27 of the flange clamp 26 is driven by the drive portion 28 and moved to the engagement position shown in FIG. 4. The engagement portions 27 at the engagement position interfere with the traffic line of the wafer transportation container 10 and are engaged with the flange 13. As understood from comparison between FIG. 3 and FIG. 4, in accordance with descent of the drive shaft 28a, the engagement portion 27 rotates and moves from the retreat position shown in FIG. 3 to the engagement position shown in FIG. 4 and is engaged from above (in more detail, from above diagonally backward) with the flange 13 of the wafer transportation container 10 located at the dock position.

As shown in FIG. 4, the engagement portion 27 at the engagement position is engaged with the flange 13 so as to push the flange opposing surface 13b of the wafer transportation container 10 against the periphery opposing surface 25a of the frame 24. This can improve the sealability between the flange opposing surface 13b and the periphery opposing surface 25a and prevent the wafer transportation container 10 from deviating from a formal position due to vibration or so of the opening operation of the lid 14 by the door 32. In particular, as shown in FIG. 4, the engagement between the engagement portion 27 and the flange 13 preferably enables the flange opposing surface 13b to be upright and to be positioned between the lid outer surface 14a and the lid back surface 14b in the transportation direction of the wafer transportation container 10 by the installation part 22. When the engagement portions 27 hold the wafer transportation container 10 in such a posture, the door 32 can smoothly open the lid 14, and the sealability between the flange opposing surface 13b and the periphery opposing surface 25a can be enhanced in the opening operation of the lid 14.

As shown in FIG. 3 and FIG. 4, at least when the engagement portion 27 is stopped, the flange clamp 26 is disposed between the periphery opposing surface 25a of the frame 24 and the cover separate surface 30a located farthest from the periphery opposing surface 25a of the cover portion 30 in the transportation direction of the wafer transportation container 10 by the installation part 22. Preferably, the flange clamp 26 is disposed within 75 mm from the periphery opposing surface 25a in the transportation direction (Y-axis direction) of the wafer transportation container 10 by the installation part 22. Thus, the flange clamp 26 is small, and a movement distance of the engagement portions 27 for engagement with the flange 13 can be small.

The cover portion 30 is thicker than the flange clamp 26 in the transportation direction of the wafer transportation container 10 by the installation part 22. When the flange clamp 26 is thinner than the cover portion 30 so as not to protrude toward the installation table 23 by the cover separate surface 30a, the flange clamp 26 can be prevented from contacting with the wafer transportation container 10 in transporting the wafer transportation container 10 upwardly by OHT or so.

Since the load port apparatus 20 includes the engagement portions 27 configured to be engaged with the flange groove 13a of the wafer transportation container 10, the small engagement portions 27 can favorably support the connection state between the frame opening 24a and the main opening 12a of the wafer transportation container 10. Since the flange 13 is disposed close to the frame periphery 25 at the dock position, it is possible to reduce a movement distance of the engagement portions 27 and reduce the time for the motion of the flange clamp 26. Moreover, the engagement portions 27 can support the connection state between the frame opening 24a and the main opening 12a of the wafer transportation container 10 along with the bottom clamp configured to be engaged with the bottom of the wafer transportation container 10. In particular, when the engagement portions 27 are engaged with the flange 13 above the center of the wafer transportation container 10, the load port apparatus 20 can also hold the upper part of the wafer transportation container 10, which is easily displaced if fixed by only the bottom clamp, at an appropriate position.

Figure 5A:
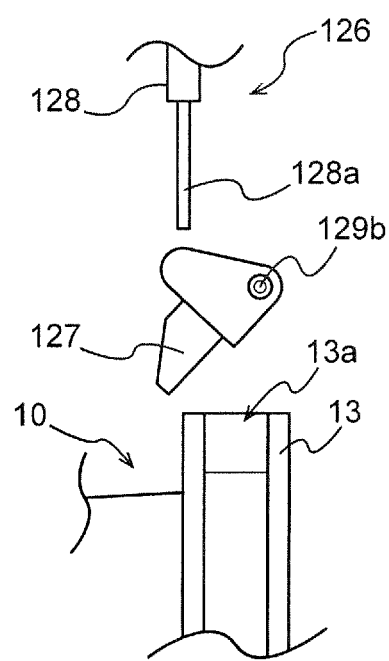
FIGS. 5A and 5B are conceptual views illustrating a motion state of a flange clamp according to First Variation.
Figure 5B:
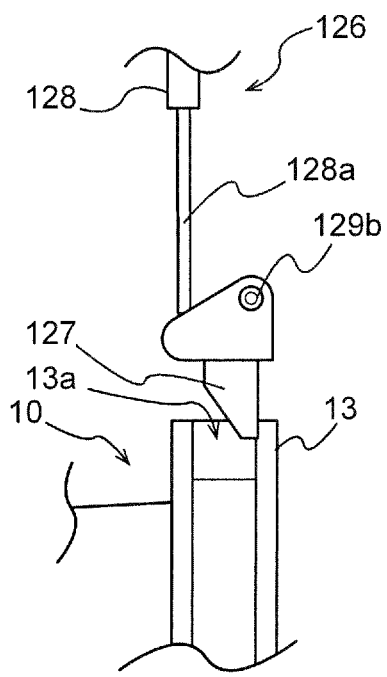

The present invention is described with reference to the embodiment, but is not limited to the above-mentioned embodiment, and needless to say, includes many other embodiments and variations. For example, the shape and structure of the flange clamp 26 are not limited to those exemplified in FIG. 3 and FIG. 4. FIG. 5A and FIG. 5B are a conceptual view illustrating a flange clamp 126 according to First Variation. FIG. 5A illustrates the flange clamp 126 at a retreat position, and FIG. 5B illustrates the flange clamp 126 at an engagement position.

In the flange clamp 126, a drive shaft 128a of a drive portion 128 and an engagement portion 127 are not connected, and the engagement portion 127 at the retreat position is away from the drive shaft 128a as shown in FIG. 5A. The engagement portion 127 is rotatably attached to a frame by a connection part 129b. The engagement portion 127 at the retreat position is energized by an energization member (not shown). The engagement portion 127 is located at the retreat position, which does not interfere with a traffic line of the wafer transportation container 10, when receiving no force from the drive shaft 128a.

In the flange clamp 126, as shown in FIG. 5B, the drive shaft 128a of the drive portion 128 extends or moves downwardly and contacts with the engagement portion 127, and the engagement portion 127 is thereby rotated and engaged with the flange groove 13a. Thus, the drive portion 128 of the flange clamp 126 should move the engagement portion 127 between the retreat position and the engagement position, but the drive portion 128 and the engagement portion 127 are not necessarily connected with each other as shown in FIG. 5A.

FIG. 6A and FIG. 6B are a conceptual view illustrating a flange clamp 226 according to Second Variation. FIG. 6A illustrates the flange clamp 226 at a retreat position, and FIG. 6B illustrates the flange clamp 226 at an engagement position.

In the flange clamp 226, a drive shaft 228a of a drive portion 228 and an engagement portion 227 are fixed, and the engagement portion 227 moves vertically in accordance with extension or movement of the drive shaft 228a. As shown in FIG. 6A, the engagement portion 227 at the retreat position is fixed to the drive shaft 228a withdrawn or moved upwardly and does not interfere with a traffic line of the wafer transportation container 10.

As shown in FIG. 6B, the flange clamp 226 downwardly extends or moves the drive shaft 228a of the drive portion 228, and the flange clamp 226 downwardly moves the engagement portion 227 fixed to the lower tip of the drive shaft 228a and engages the engagement portion 227 with the flange groove 13a. The engagement portion 227 is provided with a rotatable roller 227a and can smoothly be engaged with the flange groove 13a by rotation of the roller 227a in contacting with the flange groove 13a. Thus, the engagement portion 227 of the flange clamp 226 may be fixed to the drive portion 228 and may move rotationally or linearly.

DESCRIPTION OF THE REFERENCE NUMERICAL

10 . . . wafer transportation container
12 . . . housing

12a . . . main opening
13 . . . flange
13a . . . flange groove
13b . . . flange opposing surface
13c . . . rib
14 . . . lid
14a . . . lid outer surface
14b . . . lid back surface
20 . . . load port apparatus
22 . . . installation part
23 . . . installation table
24 . . . frame
24a . . . frame opening
25 . . . frame periphery
25a . . . periphery opposing surface
26, 126, 226 . . . flange clamp
27, 127, 227 . . . engagement portion
227a . . . roller
28, 128, 228 . . . drive portion
28a, 128a, 228a . . . drive shaft
29a, 29b, 129b . . . connection part
30 . . . cover portion
30a . . . cover separate surface
31 . . . state display lamp
32 . . . door
34 . . . seal portion

What is claimed is:

1. A load port apparatus for connecting a main opening of a wafer transportation container with a frame opening, comprising:
   an installation part having an installation table configured to install the wafer transportation container and move to and from the frame opening;
   a frame being upright from the installation part and having the frame opening; and
   a flange clamp directly attached to the frame and including:
      an engagement portion configured to be engaged with a flange surrounding an outer circumference of the main opening; and
      a drive portion configured to drive the engagement portion,
   wherein the engagement portion is engaged from above or the side with a flange groove formed in the flange and opening radially outwardly.

2. The load port apparatus according to claim 1, wherein the flange clamp is disposed within 75 mm from a periphery opposing surface of a periphery of the frame opening facing the flange in a transportation direction of the wafer transportation container by the installation part.

3. The load port apparatus according to claim 1, wherein the engagement portion is disposed above the frame opening.

4. The load port apparatus according to claim 1, wherein the drive portion moves the engagement portion between:
   a retreat position failing to interfere with a traffic line of the wafer transportation container; and
   an engagement position interfering with the traffic line and engaged with the flange.

5. The load port apparatus according to claim 1, wherein a direction that the drive portion moves the engagement portion is approximately perpendicular to a direction that the engagement portion pushes the flange.

6. A load port apparatus for connecting a main opening of a wafer transportation container with a frame opening, comprising:
   an installation part having an installation table configured to install the wafer transportation container and move to and from the frame opening;
   a frame being upright from the installation part and having the frame opening;
   a flange clamp directly attached to the frame and including:
      an engagement portion configured to be engaged with a flange surrounding an outer circumference of the main opening; and
      a drive portion configured to drive the engagement portion; and
   a cover portion disposed at least at an upper part or a side part of the frame opening and at least partially covering a periphery of the frame opening,
   wherein at least when the engagement portion is stopped, the flange clamp is disposed between a periphery opposing surface of the periphery facing the flange and a cover separate surface of the cover portion located farthest from the periphery opposing surface in a transportation direction of the wafer transportation container by the installation part.

7. The load port apparatus according to claim 6, wherein the cover portion is thicker than the flange clamp in the transportation direction.

8. The load port apparatus according to claim 6, wherein the flange clamp is disposed within 75 mm from the periphery opposing surface in the transportation direction.

9. The load port apparatus according to claim 6, wherein the engagement portion is disposed above the frame opening.

10. The load port apparatus according to claim 6, wherein the drive portion moves the engagement portion between:
    a retreat position failing to interfere with a traffic line of the wafer transportation container; and
    an engagement position interfering with the traffic line and engaged with the flange.

11. The load port apparatus according to claim 6, wherein the engagement portion is engaged with the flange so as to push a flange opposing surface of the flange facing the periphery opposing surface against the periphery opposing surface.

12. The load port apparatus according to claim 11, wherein an engagement of the engagement portion with the flange enables the flange opposing surface to be positioned between:
    a lid outer surface of a lid attached detachably to the main opening, wherein the lid outer surface faces a door configured to be engaged with the lid; and
    a lid back surface opposite to the lid outer surface in the transportation direction.

13. A method of driving a load port apparatus for connecting a main opening of a wafer transportation container with a frame opening of a frame of the load part apparatus, the frame being upright from an installation table of the load part apparatus and having the frame opening, the method comprising:
    a step of moving an installation table installing the wafer transportation container to a dock position where the main opening moves close to the frame opening; and
    a step of driving an engagement portion configured to be engaged with a flange surrounding an outer circumference of the main opening by a drive portion configured to drive the engagement portion so as to engage the engagement portion with the wafer transportation container located at the dock position, wherein the engagement portion is directly attached to the frame and is engaged from above or the side with a flange groove formed in the flange and opening radially outwardly.

* * * * *